United States Patent
Shao et al.

(10) Patent No.: US 10,810,932 B2
(45) Date of Patent: Oct. 20, 2020

(54) MOLDED LED DISPLAY MODULE AND METHOD OF MAKING THEREROF

(71) Applicant: SCT LTD., Grand Cayman (KY)

(72) Inventors: Shihfeng Shao, Milpitas, CA (US); Heng Liu, Milpitas, CA (US); Chang Hung Pan, Milpitas, CA (US)

(73) Assignee: SCT LTD., Grand Cayman (KY)

( * ) Notice: Subject to any disclaimer, the term of this patent is extended or adjusted under 35 U.S.C. 154(b) by 60 days.

(21) Appl. No.: 16/149,645

(22) Filed: Oct. 2, 2018

(65) Prior Publication Data

US 2020/0105184 A1  Apr. 2, 2020

(51) Int. Cl.
| | |
|---|---|
| *G09G 3/32* | (2016.01) |
| *H01L 33/48* | (2010.01) |
| *H01L 33/56* | (2010.01) |
| *H01L 33/62* | (2010.01) |
| *H05K 1/18* | (2006.01) |

(52) U.S. Cl.
CPC ............. *G09G 3/32* (2013.01); *H01L 33/486* (2013.01); *H01L 33/56* (2013.01); *H01L 33/62* (2013.01); *H05K 1/188* (2013.01); *H05K 2201/10106* (2013.01); *H05K 2201/10128* (2013.01)

(58) Field of Classification Search
CPC .......... G09G 3/32; H01L 33/56; H01L 33/62; H01L 33/486; H05K 1/188; H05K 2201/10106; H05K 2201/10128
See application file for complete search history.

(56) References Cited

U.S. PATENT DOCUMENTS

| | | | | |
|---|---|---|---|---|
| 5,399,850 | A * | 3/1995 | Nagatani | G06K 7/14 250/208.1 |
| 9,112,129 | B2 * | 8/2015 | An | H01L 33/647 |
| 9,158,151 | B2 * | 10/2015 | Ogata | G02F 1/133611 |
| 9,728,690 | B2 * | 8/2017 | Ukawa | H01L 33/507 |
| 9,799,803 | B2 * | 10/2017 | Tagami | H01L 33/486 |
| 9,966,517 | B2 * | 5/2018 | Oda | H01L 21/6835 |
| 10,121,942 | B2 * | 11/2018 | Shirahama | H01L 33/52 |
| 2001/0042865 | A1 * | 11/2001 | Oshio | H01L 33/486 257/100 |
| 2004/0169451 | A1 * | 9/2004 | Oishi | H01L 33/64 313/45 |
| 2005/0001219 | A1 * | 1/2005 | Minamio | H01L 31/0203 257/79 |
| 2005/0074565 | A1 * | 4/2005 | Cok | B82Y 20/00 428/1.1 |
| 2006/0038187 | A1 * | 2/2006 | Ueno | H01L 33/508 257/81 |
| 2006/0060867 | A1 * | 3/2006 | Suehiro | H01L 33/56 257/81 |

(Continued)

*Primary Examiner* — Amy Onyekaba
(74) *Attorney, Agent, or Firm* — Novick, Kim & Lee, PLLC; Allen Xue

(57) ABSTRACT

An LED display module contains a substrate, and an array of light emitting devices arranged in rows and columns on a substrate. Each light emitting device has a LED chip electrically connected to contact pads on the substrate, a black resin portion covering around the contact pad, and a transparent resin portion molded around the LED chip and the black resin portion. By forming the black resin portion around each metal pad, the LED display module provides an increased contrast ratio for the display surface.

19 Claims, 3 Drawing Sheets

(56) References Cited

U.S. PATENT DOCUMENTS

| | | | |
|---|---|---|---|
| 2006/0186425 A1* | 8/2006 | Yano | F21K 9/68 257/98 |
| 2006/0261364 A1* | 11/2006 | Suehiro | C03C 27/06 257/100 |
| 2007/0063209 A1* | 3/2007 | Sugiura | H01L 33/60 257/98 |
| 2009/0091045 A1* | 4/2009 | Tanikawa | C08G 59/306 257/791 |
| 2009/0108282 A1* | 4/2009 | Matsuda | H01L 33/508 257/98 |
| 2009/0166664 A1* | 7/2009 | Park | H01L 33/641 257/99 |
| 2009/0302342 A1* | 12/2009 | Kondo | H01L 33/52 257/98 |
| 2010/0013069 A1* | 1/2010 | Kasuya | H01L 23/49548 257/676 |
| 2010/0055811 A1* | 3/2010 | Lin | H05K 1/0204 438/26 |
| 2010/0078667 A1* | 4/2010 | Cheng | H01L 33/504 257/98 |
| 2011/0121339 A1* | 5/2011 | Wu | H01L 33/54 257/98 |
| 2011/0254039 A1* | 10/2011 | Kim | H01L 24/97 257/98 |
| 2012/0025258 A1* | 2/2012 | Chan | H01L 33/62 257/99 |
| 2012/0074452 A1* | 3/2012 | Chan | H01L 33/505 257/99 |
| 2012/0132942 A1* | 5/2012 | Wang | H01L 33/486 257/98 |
| 2012/0162998 A1* | 6/2012 | Takahashi | F21V 3/00 362/363 |
| 2012/0217525 A1* | 8/2012 | Chan | H01L 33/486 257/98 |
| 2012/0244652 A1* | 9/2012 | Chen | H01L 33/505 438/27 |
| 2012/0286301 A1* | 11/2012 | Kobayakawa | H01L 25/0753 257/88 |
| 2014/0014980 A1* | 1/2014 | Morimoto | H01L 33/501 257/88 |
| 2014/0084312 A1* | 3/2014 | Huang | H01L 25/0753 257/88 |
| 2015/0034983 A1* | 2/2015 | Takenaka | H01L 33/502 257/98 |
| 2016/0351539 A1* | 12/2016 | Bower | H01L 25/0655 |
| 2016/0365392 A1* | 12/2016 | Li | H01L 27/3232 |
| 2017/0092823 A1* | 3/2017 | Ukawa | H01L 33/486 |
| 2017/0148965 A1* | 5/2017 | Abe | H01L 33/62 |
| 2017/0287789 A1* | 10/2017 | Bower | H01L 25/167 |
| 2018/0226552 A1* | 8/2018 | Lee | H01L 33/505 |
| 2018/0331264 A1* | 11/2018 | Ohashi | C03C 8/20 |
| 2018/0348925 A1* | 12/2018 | Wang | G02F 1/13338 |
| 2019/0259739 A1* | 8/2019 | Bibl | H01L 33/56 |

\* cited by examiner

MOLDED LED DISPLAY MODULE AND METHOD OF MAKING THEREROF

TECHNICAL FIELD

The present disclosure relates to electronic packaging, and more particularly, to a light-emitting diode (LED) display module with a high contrast ratio and methods to make the same.

BACKGROUND

LED packages are assemblies that house LED chips. There are many types of LED packages in use today, each with particular applications and advantages. The functions of LED packages include protecting the LED chips and welded lead wires from direct contact with the environment, securing and encapsulating the chip with a molding compound (e.g., an epoxy resin or silicone resin), and allowing for versatility and standardization in LED lighting applications. Surface-mount device (SMD) LED, chip-on-board (COB) LED, multi-COB (MCOB) LED are some of the common LED packaging technologies.

A SMD LED module uses surface-mount technology (SMT) to mount LED chips on printed circuit boards (PCB). The SMD LED module generally includes a driver PCB carrying a large number of surface-mount LED devices arranged in rows and columns. Each SMD LED device may carry a vertically oriented, linear array of red, green and blue LEDs defining a pixel. The SMD LED devices may be disposed on an intermediate substrate (e.g. lead frame) that is coupled to conductive elements on PCB.

A COB or MCOB LED module, on the other hand, has an array of LED chips bonded directly to a substrate, e.g., a PCB. Since a COB LED does not require accessories such as the lead frame, it takes up less space on the PCB so that the COB LED module can have a greater density of LEDs than the SMD LED module. When the COB LED package is energized, it appears more like a lighting panel than multiple individual lights as would be the case when using several SMD LEDs mounted closely together. The higher density of COB LED module accomplish a higher luminance.

In both SMD and COB types of LED module, the light emitting devices are electrically connected to contact pads on the substrate, which in turn are connected to the electrical signal processing and driver circuitry. These pads are generally made of a metal such as gold, and thus they can reflect light outwardly through a molding layer surrounding the LEDs. This reflection competes with the lights emission by the LEDs themselves and can substantially decrease the contrast ratio of the display surface.

The contrast ratio is the ratio of highest luminance (brightness density) of a LED display over the lowest luminance. The lowest luminance can be the luminance of the display in a totally dark environment. Alternatively, the lowest luminance of the display has been defined as the luminance when it is in an OFF state. A display with a higher contrast ratio has a higher dynamic range of applications. There is a need to have an LED display module with high contrast ratios.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In some embodiments of this disclosure, the LED display module of the present disclosure comprises a substrate, and an array of light emitting devices arranged in rows and columns on a substrate. Each device comprises a LED chip electrically connected to contact pads on the substrate, a black resin portion covering around the contact pad, and a transparent resin portion molded around the LED chip and the black resin portion. The LED chip is disposed on a base pad mounted on the substrate, and a second black resin portion covers around the base pad.

In a further embodiment, the substrate is a printed circuit board (PCB), and the light emitting devices are coupled to conductive elements on the PCB. Alternatively, the light emitting devices are disposed on a support structure, e.g., a lead frame, that is coupled to conductive elements on a printed circuit board (PCB).

In another embodiment, the black resin portion is made of a mixture of black pigment in epoxy resin or silicone resin. The black pigment can be a carbon powder. The black resin portion also has an island shape having a flat top and flat side walls that covers the contact pad. The black resin portion has a thickness ranging from 5 μm to 500 μm. The transparent resin portion is made from epoxy resin or silicone resin.

The current disclosure also provides a method for fabricating a light emitting diode (LED) display module. The method comprises providing a substrate having a plurality of contact pads, mounting an array of light emitting devices having LED chips, electrically connecting the LED chip to the contact pads, on the substrate, covering one or more of the plurality of contact pads with a black resin portion, and covering the LED chip and the black resin-covered contact pads with a transparent resin layer. In this method, the LED chip is disposed on a base pad mounted on the substrate, and a second black resin portion covers around the base pad. The black resin portion can be selectively printed on the contact pads or the base pad.

BRIEF DESCRIPTION OF THE DRAWINGS

The teachings of the present invention can be readily understood by considering the following detailed description in conjunction with the accompanying drawings.

DETAILED DESCRIPTION

Figure 1:
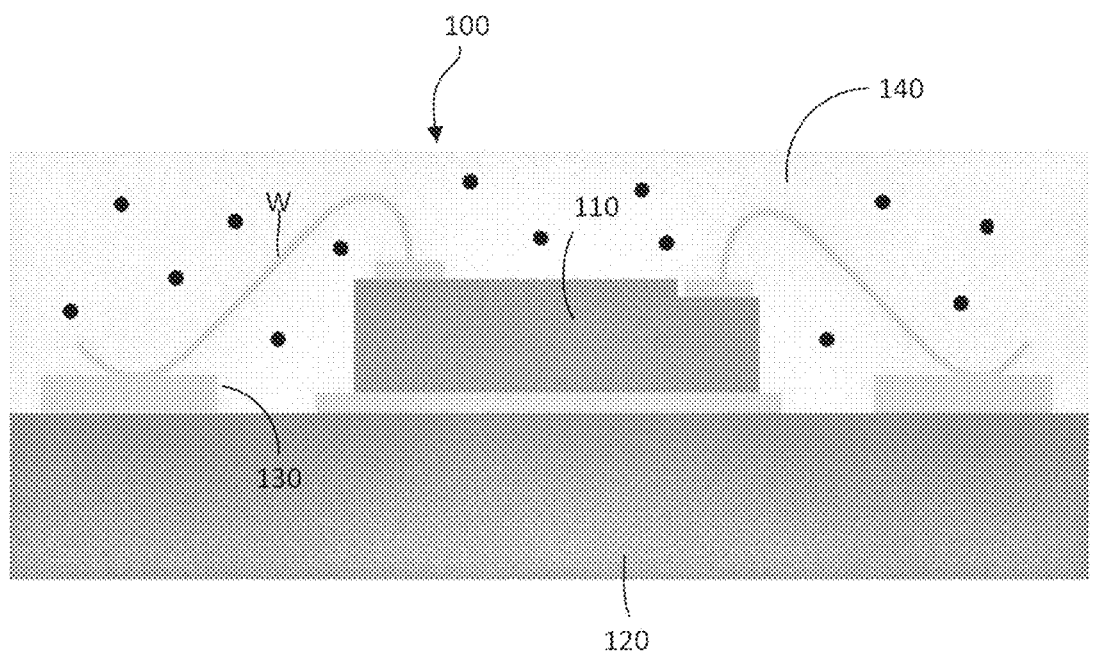
FIG. 1 is a schematic view illustrating a lateral cross section of a prior art LED package.

Reference will now be made in detail to embodiments of the present disclosure, examples of which are illustrated in the accompanying drawings. It is noted that wherever practicable, similar or like reference numbers may be used in the drawings and may indicate similar or like elements.

The drawings depict embodiments of the present disclosure for purposes of illustration only. One skilled in the art would readily recognize from the following description that alternative embodiments exist without departing from the general principles of the present disclosure.

Figure 2:
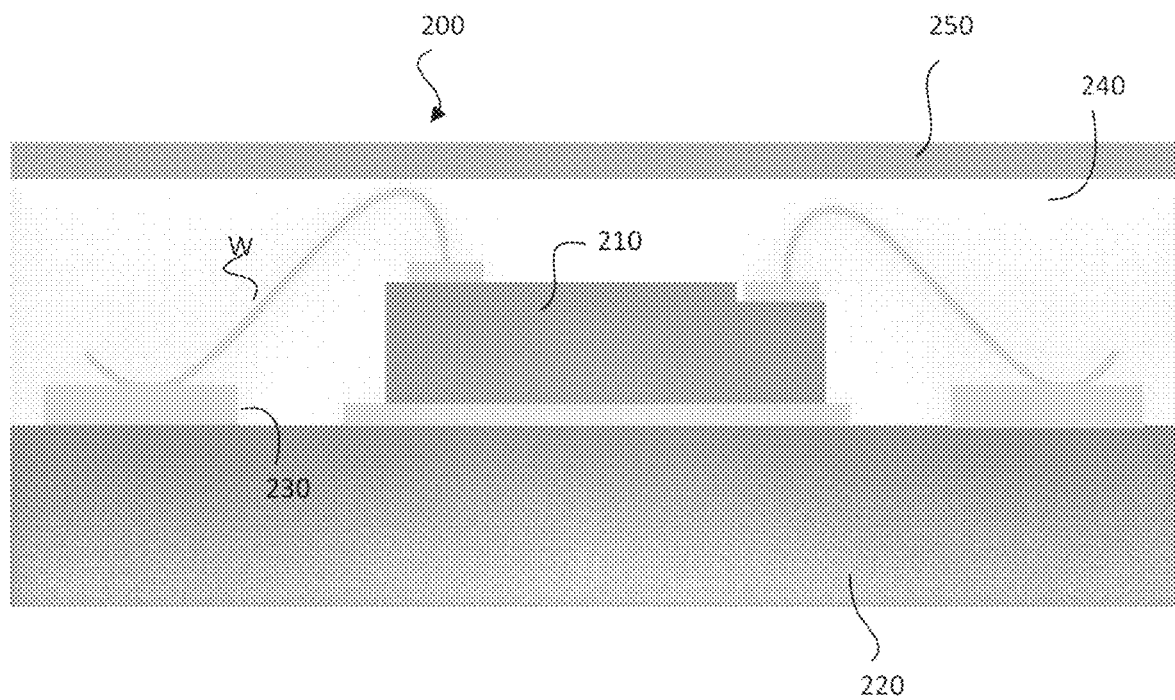
FIG. 2 is a schematic view illustrating a lateral cross section of another prior art LED package.

FIGS. 1 and 2 illustrate lateral cross sections of two existing COB LED packages. As illustrated in FIGS. 1 and 2, LED display module (100 or 200) includes a driver PCB (120 or 220). Each driver PCB carries an array of LED chips (110 or 210) defining pixels. The LED chip (110 or 210) is electrically connected to contact pads (130 or 230) on the PCB (120 or 220) by bonding wires (W), which are connected via traces on the PCB to the electrical signal processing and driver circuitry (not shown). The contact pads (130 or 230) are made of a metallic material that may reflect lights through molding layers surrounding the LED chips. To reduce this reflection, the existing LED package in FIG. 1 uses a molding layer 140 that contains 0.1% to 3.0% of a dark pigment, e.g., carbon powder. The resulting molding layer appears black or opaque. This opaque or black molding layer blocks the lights from the LEDs and reduces the luminance of the display. In this application, the words "black" or "dark" as in "black molding layer," "black resin," etc. generally means that the substance is not transparent. It refers to various degrees of opaqueness, from lighter to darker.

Another existing LED package as illustrated in FIG. 2 includes a transparent resin layer 240 covering the LED chip 210 and the contact pads 230, and a black layer 250 on the transparent resin layer 240. The black layer 250 has a transparency of 1% to 30%. It can be readily appreciated that in FIGS. 1 and 2 the light from the LED chip as well as the reflection from the contact pads are partially block.

Figure 3:
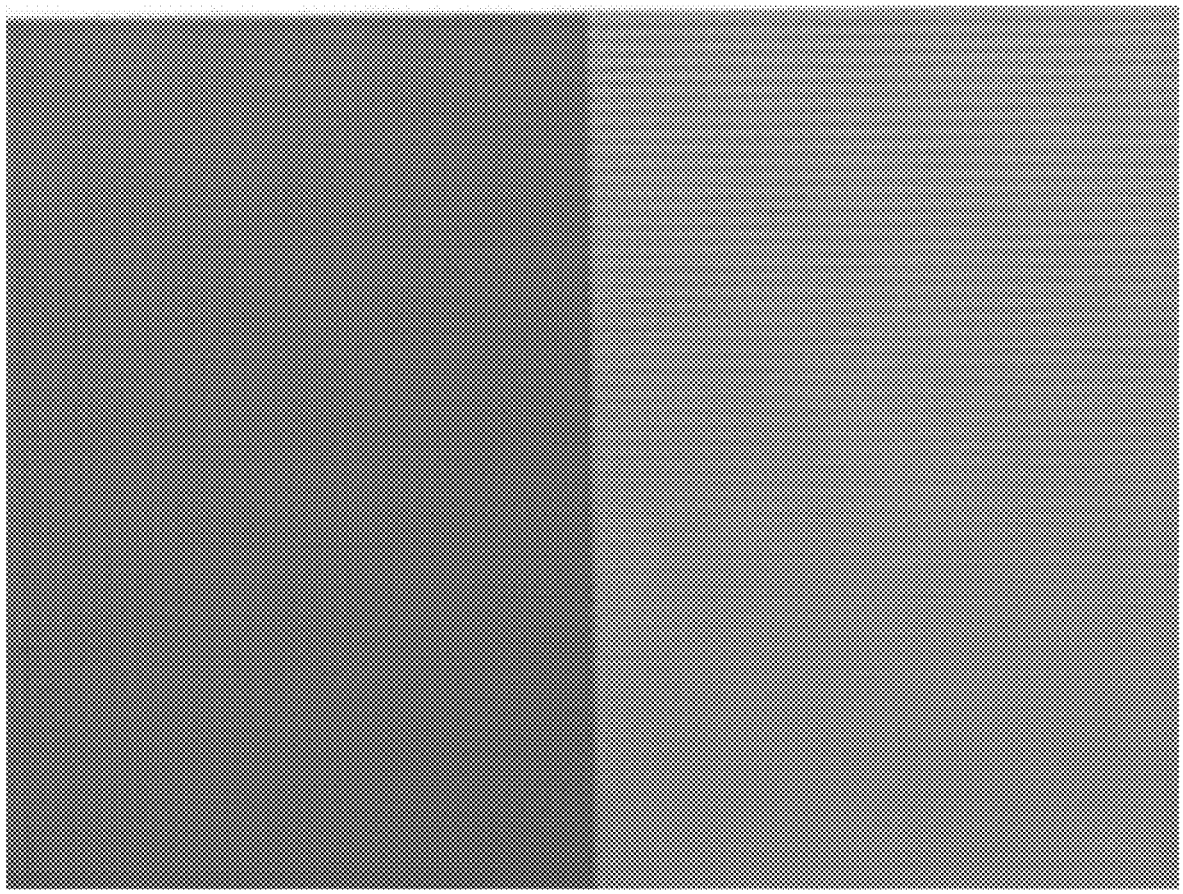
FIG. 3 is a photograph showing the surface of a device according to FIG. 2 and that of a device without a black layer.

FIG. 3 shows the effect of the configuration illustrated in FIG. 2. The left panel is a picture of the surface of the LED display module according to FIG. 2. The black layer 250 has a transparency of 30%. The right panel shows the surface of the same LED display module except that it does not have the black layer 250. It can be readily appreciated that the surface on the left is significantly darker than the surface on the right. This effect is due to the fact that the black layer 250 absorbs lights from the wire W and the contact pads 230. In contrast, without the black layer 250, the wire W and the contact pads 230 reflect light outwardly through the transparent resin layer without much impendence so that it brighter when OFF and has a lower contrast ratio.

Figure 4:
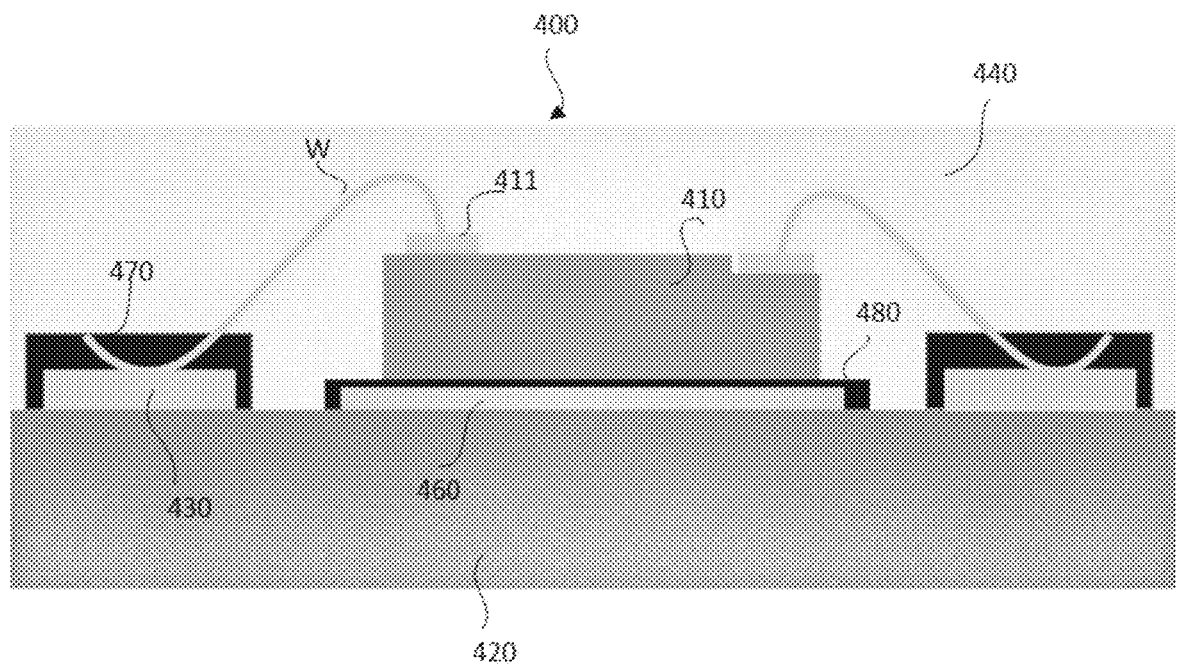
FIG. 4 is a schematic view illustrating a lateral cross section of the LED package according to one embodiment in the present disclosure.

FIG. 4 illustrates a lateral cross section of the COB LED package of the present disclosure. The LED module 400 includes a substrate 420 and an array of LED chips arranged in rows and columns on the substrate. In this embodiment, a printed circuit board (PCB) constitutes the substrate, and the LEDs are directly coupled to conductive elements on PCB.

The PCB is connected to or may include a driver circuit. Although details of the driver circuit are not shown in the present disclosure, in some embodiments, the driver circuit may include a phase lock loop, a plurality of pulse width modulation engines, a configuration register, a plurality of gain adjustable fast charge current sources, and a serial input/output interface. In some embodiments, where components are to be placed, PCB may have flat, usually tin-lead, silver, or gold plated copper pads without holes, called solder pads. Solder paste, a sticky mixture of flux and tiny solder particles, can be first applied to all the solder pads with a stainless steel or nickel stencil using a screen printing process. It can also be applied by a jet-printing mechanism, similar to an inkjet printer.

In this embodiment, each LED chip 410 has a pair of contacts 411 on the top of the chip. The pair of contacts 411 includes a p-contact and a n-contact, which respectively coupled to a p-layer and a n-layer (not shown) of each LED chip 410. In the embodiment shown in FIG. 4, the contacts 411 of the LED chip 410 can be electrically connected to the contact pads 430 on the substrate 420 by bonding wires W. In another embodiment, the wires may be eliminated by having contacts on the bottom of the chip, in which those contacts directly connected to the contact pads disposed beneath the chip, i.e., flip chip. The material of the contact pads can be single material, or be a multi-layered material. The metallic material can be an alloy of nickel, gold, silver, aluminum, titanium, tungsten, cadmium, vanadium, platinum, and the likes.

The LED chips 410 may be disposed on a base pad 460, which is mounted on the substrate via a bonding layer (not shown). The base pad 460 is made of a thermal conductive material, e.g., metal, alloy, solder, and therefore it transfers heat from the LED chip to the substrate. The bonding layer (not shown) is an electrically and thermally conductive interface such as an adhesive, coating, film, encapsulant, solder, paste, grease and/or other suitable material such as baked silver epoxy.

In this embodiment, a first black resin portion 470 covers each contact pad 430 and a second black resin portion 480 covers the base pad 460. The black resin portions 470 and 480 are made of epoxy or silicone that contains a black pigment. In certain specific embodiments, the black resin portions 470 and 480 may be in the form of an island having a flat top and flat side walls to conform to the shape of each pad.

By way of example and not limitation, the first and second black resin portion may have a thickness ranging from 5 μm to 500 μm. The black resin portions 470 and 480 may be formed by inkjet printing on the metal pads 430 and 460, or by other suitable methods, e.g. masking, screen printing. In a preferred embodiment, the black resin is printed on the base pad 460 before the LED chip is disposed on the based pad. In a further embodiment, the black resin can be applied on the p- and n-contacts 411 as well as the metal pads 430 and 460.

After forming the black resin portions 470 and 480 covering the metal pads 430 and 460, a transparent resin portion 440 is molded around the LED chips 410, covering the black resin portions 470 and 480. The transparent resin portion 440 is made from a clear resin or silicone. In some embodiments, the transparent resin portion 440 may be formed by encapsulating process. In the embodiments of this disclosure, the black resin portions 470 and 480 can be selectively molded or printed around each contact or base pad. The black resin has a low transparency, e.g., less than 20%, less than 10%, less than 5%. Accordingly, the light reflection from metal pads are substantially blocked.

Figure 5:
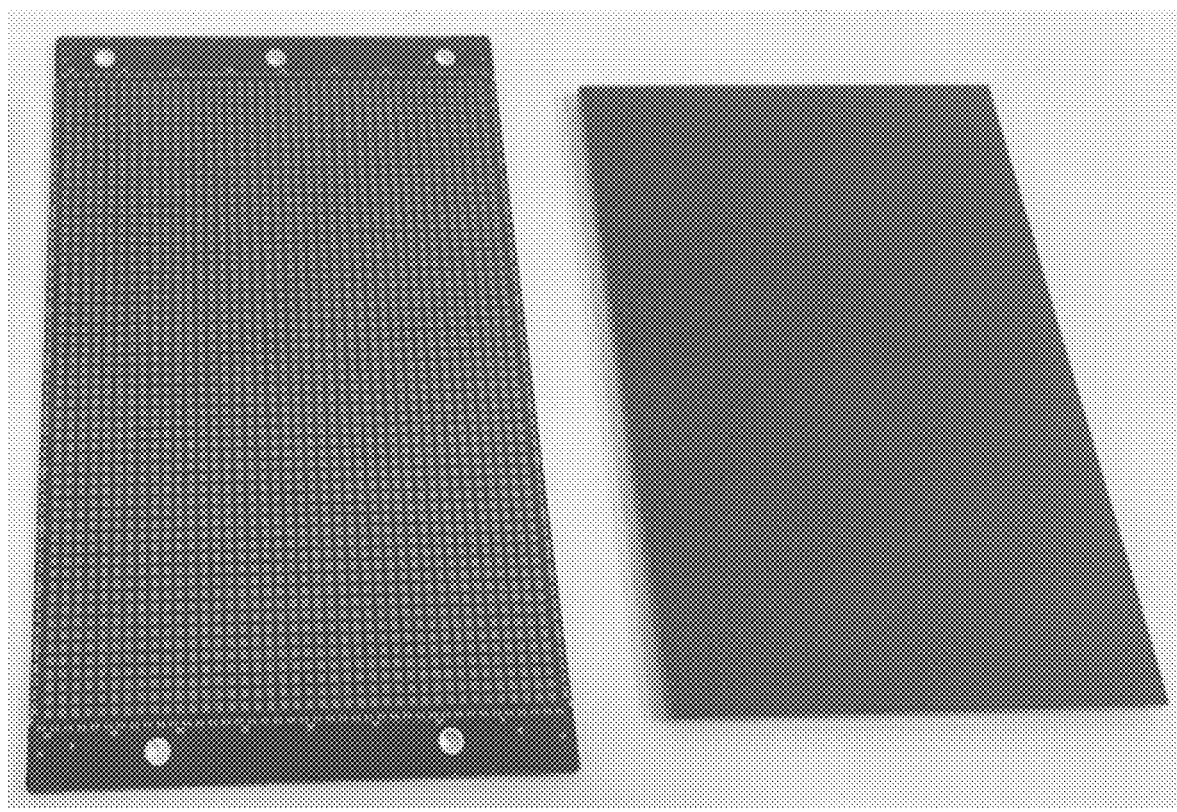
FIG. 5 is a photograph showing a surface of an embodiment of the current disclosure in comparison with the surface of the device according to FIG. 1.

FIG. 5 is a picture comparing a surface of the embodiment in FIG. 4 on the right the LED display module of FIG. 1 on the left, which has a molding compound containing 2% of the carbon powder. The inventive embodiment on the right is significantly darker when it is OFF. As such, the inventive LED display achieves a higher contrast ratio than the prior art LED display module.

The method of selectively covering exposed contact pads with a black resin is also applicable to SMD LED display modules. In that case, the exposed contact pads may be on the PCB or on the lead frame of the SMD LED.

Embodiments of the present disclosure have been described in detail. Other embodiments will become apparent to those skilled in the art from consideration and practice of the present disclosure. Accordingly, it is intended that the specification and the drawings be considered as exemplary and explanatory only, with the true scope of the present disclosure being set forth in the following claims.

What is claimed is:

1. A light emitting diode (LED) display module, comprising: a substrate; and an array of light emitting devices arranged in rows and columns on the substrate, each light emitting device comprising: an LED chip electrically connected to one or more contact pads on the substrate; one or more black resin portions, wherein at least one of the one or more contact pads is in contact with and covered by one of the one or more black resin portions; and a transparent resin portion contacting and covering the LED chip and the one or more black resin portions.

2. The LED display module of claim 1, further comprising: two or more black resin portions, wherein the LED chip is disposed on a base pad mounted on the substrate, and the base pad is in contact with and covered by one of the two or more black resin portions.

3. The LED display module of claim 1, wherein the substrate is a printed circuit board (PCB), and the light emitting devices are coupled to conductive elements on the PCB.

4. The LED display module of claim 1, wherein the light emitting devices are disposed on the substrate via a lead frame that is coupled to conductive elements on a printed circuit board (PCB).

5. The LED display module of claim 1, wherein each of the one or more black resin portions comprises a black pigment and an epoxy resin or a silicone resin.

6. The LED display module of claim 1, wherein each of the one or more black resin portions has a shape that conforms to a shape of one of the one or more contact pads.

7. The LED display module of claim 1, wherein each of the one or more black resin portion has a thickness ranging from 5 μm to 500 μm.

8. The LED display module of claim 1, wherein the transparent resin portion is made from a resin, an epoxy resin, or a silicone resin.

9. The LED display module of claim 1, wherein each of the one or more black resin portions has a transparency of less than 20%.

10. The LED display module of claim 9, wherein the transparency is less than 5%.

11. A method for fabricating a light emitting diode (LED) display module, comprising: providing a substrate having a plurality of contact pads disposed thereon; mounting an array of light emitting devices, each light emitting device including an LED chip electrically connected to one or more of the plurality of contact pads on the substrate; contacting and covering each of the plurality of contact pads with a black resin to form a plurality of black resin-covered contact pads; and contacting and covering the LED chip and the plurality of black resin-covered contact pads with a layer of transparent molding compound.

12. The method for fabricating the LED display module of claim 11, comprising: contacting and covering a base pad on the substrate with the black resin; and disposing the LED chip on the black resin-covered base pad.

13. The method for fabricating the LED display module of claim 12, wherein the black resin comprises a black pigment and an epoxy resin or a silicone resin.

14. The method for fabricating the LED display module of claim 13, wherein the black resin is applied to the base pad by inkjet printing, masking, or screen printing.

15. The method for fabricating the LED display module of claim 11, wherein the substrate is a printed circuit board (PCB), and the light emitting devices are coupled to conductive elements on the PCB.

16. The method for fabricating the LED display module of claim 11, wherein the light emitting devices are surface-mount devices (SMDs) that are disposed on the substrate.

17. The method for fabricating the LED display module of claim 11, wherein the black resin is applied on the plurality of contact pads by inkjet printing, masking, or screen printing.

18. The method of claim 11, wherein the black resin has a transparency of less than 20%.

19. The method of claim 18, wherein the transparency is less than 5%.

\* \* \* \* \*